United States Patent [19]

Karlicek, Jr.

[11] Patent Number: 4,729,968
[45] Date of Patent: Mar. 8, 1988

[54] HYDRIDE DEPOSITION OF PHOSPORUS-CONTAINING SEMICONDUCTOR MATERIALS AVOIDING HILLOCK FORMATION

[75] Inventor: Robert F. Karlicek, Jr., South Plainfield, N.J.

[73] Assignee: American Telephone and Telegraph Company, AT&T Bell Laboratories, Murray Hill, N.J.

[21] Appl. No.: 37,078

[22] Filed: Apr. 13, 1987

Related U.S. Application Data

[63] Continuation of Ser. No. 776,791, Sep. 16, 1985, abandoned.

[51] Int. Cl.$^4$ .................. H01L 7/36; H01L 21/203
[52] U.S. Cl. .................. 437/81; 156/613; 156/614; 156/642; 437/88
[58] Field of Search .......... 437/81, 88; 156/613, 156/614, 642

[56] References Cited

U.S. PATENT DOCUMENTS

| | | |
|---|---|---|
| 3,729,341 | 4/1973 | Dietz et al. .................. 148/DIG. 16 |
| 3,888,705 | 6/1975 | Fletcher et al. .................. 156/614 |
| 4,086,108 | 4/1978 | Gonda .................. 148/175 |
| 4,146,774 | 3/1979 | Fraas .................. 437/81 |
| 4,220,488 | 9/1980 | Duchemin et al. .................. 148/175 |
| 4,385,946 | 5/1983 | Finegan et al. .................. 148/175 |
| 4,468,283 | 8/1984 | Ahmed .................. 156/642 |
| 4,488,914 | 12/1984 | Quinlan et al. .................. 148/175 |
| 4,504,329 | 3/1985 | Quinlan et al. .................. 148/175 |
| 4,568,397 | 2/1986 | Hoke et al. .................. 148/175 |

OTHER PUBLICATIONS

Pogge et al., Jour. Crystal Growth, 31, (1975), 183.

Primary Examiner—Upendra Roy
Attorney, Agent, or Firm—Bruce S. Schneider

[57] ABSTRACT

Hillock formation in the vapor phase epitaxial hydride deposition of indium phosphide is avoided. This effect is accomplished by ensuring that the phosphine utilized in the deposition gas flow is essentially completely decomposed before reaching the deposition area. Additionally, by utilizing the phosphine decomposition procedure, advantageous results are also achieved in the epitaxial hydride deposition of phosphorus-containing semiconductor materials.

8 Claims, 2 Drawing Figures

HYDRIDE DEPOSITION OF PHOSPORUS-CONTAINING SEMICONDUCTOR MATERIALS AVOIDING HILLOCK FORMATION

This application is a continuation of application Ser. No. 776,791, filed Sept. 16, 1985, abandoned.

BACKGROUND OF THE INVENTION

1. Field of the Invention

This invention relates to semiconductor devices and, in particular, III-V semiconductor devices.

2. Art Background

Devices, e.g., light emitting diodes (LEDs) and lasers based on III-V semiconductor materials, generally are fabricated on a bulk semiconductor substrate such as a bulk indium phosphide substrate. A typical fabrication step involves the epitaxial deposition of a III-V semiconductor material on the heated substrate through the thermally induced reaction in a gas mixture at the substrate surface. A variety of deposition mixtures has been employed. One class of mixtures suitable for the deposition of III-V semiconductor materials containing phosphorus are those including phosphine as the source of this phosphorus. Thus, for example, for the deposition of indium phosphide, the initial gas mixture includes phosphine as a source of phosphorus and indium chloride as a source of indium.

The morphological quality of the deposited layer significantly affects device quality. A common defect in the growth of III-V based semiconductor materials by hydride epitaxy is the formation of hillocks, i.e., crystallographic defects including a portion of grown material that extends at least 0.5 $\mu$m above all other grown material within an area of 100 $\mu$m$^2$. (See G. H. Olsen, *GaInAsP Alloy Semiconductors*, edited by T. P. Pearsall, John Wiley & Sons, page 11 (1982) for a description of hydride epitaxy, i.e., an epitaxial process where the source of the Group V element is phosphine, and the walls of the reactor in the reaction region of the apparatus are heated by an external source such as a furnace). Hillocks, however, substantially degrade or catastrophically limit device properties such as current confinement, light output, electrical contact performance, and reliability. Additionally, hillocks often preclude device fabrication steps, such as contact mask pattern delineation, which depend on a planar morphology. In an attempt to limit morphological defects such as hillocks, growth on substrate surfaces that are slightly misoriented, e.g., 1 to 6 degrees misoriented from a crystallographic plane such as the (100) plane, has been attempted. Despite this precaution, substantial hillock formation still occurs. Additionally, for many structures whose fabrication depends on the use of precise crystallographic orientation, even the slight improvement attained by misorientation is precluded. For example, in the fabrication of V-groove lasers, the production of the groove depends on the in-plane crystallographic orientation of the substrate. If a misoriented substrate is utilized, an unacceptable etch structure such as a dovetail, rather than a V-groove, is obtained. Thus, hillock formation remains a significant source of degradation in device yield and efficacy.

SUMMARY OF THE INVENTION

Hillock formation in hydride transport of indium phosphide is avoided by ensuring that the phosphine utilized in the deposition procedure is essentially completely decomposed before it reaches the deposition substrate. Phosphine decomposition is achievable by a variety of expedients. For example, phosphine is typically decomposed heterogeneously at a heated surface such as a catalytic, heated surface.

The use of phosphine decomposition is also advantageous in the hydride transport chemical vapor deposition of III-V semiconductor materials such as III-V ternaries and quaternaries having a phosphorus component.

DETAILED DESCRIPTION

The inventive procedure for growing III-V semiconductor materials for production of devices such as LEDs, lasers, and photodetectors is based on a hydride deposition gas system. Hydride systems, in general, are well known and are extensively described in reviews such as Olsen supra. Basically, the Group V material(s), such as phosphorus and/or arsenic, are provided in the form of their corresponding hydride, i.e., phosphine and/or arsine. These materials are generally brought into the gas mixture using a carrier gas flow, e.g., a reactive carrier such as hydrogen or an inert carrier such as helium. (For the growth of materials containing indium, some hydrogen is generally required in the carrier. However, for materials having essentially no indium, a carrier gas having only inert constituents is acceptable.) The Group III material is brought to the reaction mixture by any of numerous conventional expedients. For example, commonly hydrogen chloride is diluted in hydrogen and passed over liquid indium. Once the reaction mixture is formed, it is passed over the deposition substrate. The deposition substrate is maintained at a temperature suitable for inducing reaction of the gas mixture to produce the desired epitaxial layer. For phosphorus-containing binaries (e.g., indium phosphide), ternaries, and quaternaries, generally temperatures in the range 600 to 750 degrees C. are adequate. The precise temperature to yield an adequate epitaxial layer for a given stoichiometry of the deposited material is determined by utilizing a controlled sample.

Figure 1:
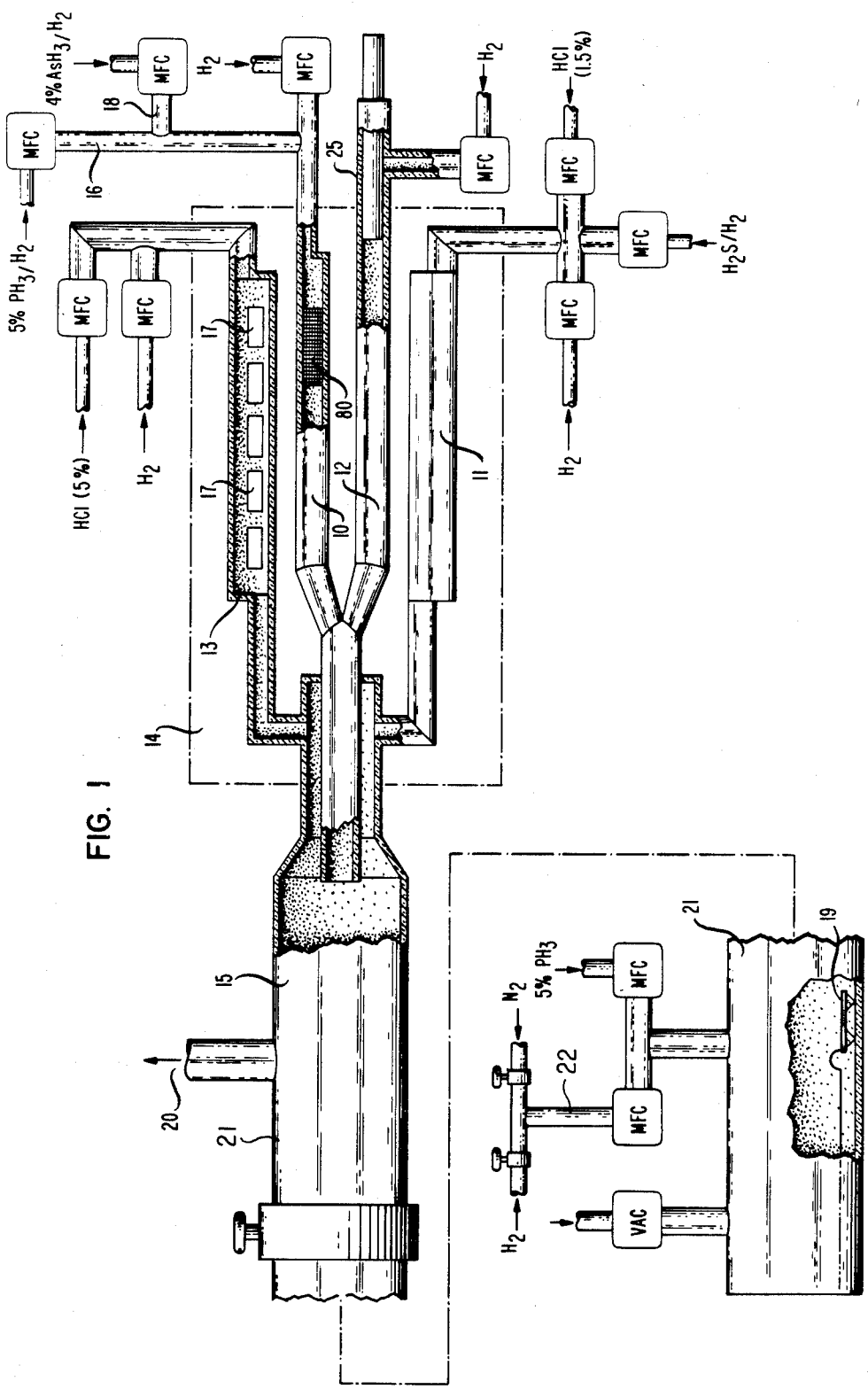
FIGS. 1 and 2 are illustrative of apparatuses suitable for practicing embodiments of the invention.

The reactor geometry is also not critical. Suitable geometries have been described in reviews such as Olsen supra. One advantageous geometry is shown in FIG. 1 and includes a quartz growth chamber 15 having at least one source of Group III material, 17, and a source of phosphine, 16. Additionally, it is possible to introduce other Group V materials through their respective hydrides, e.g., arsine from source 18. The deposition gases are exhausted from the reactor by conventional expedients such as an effluent conduit, 20. Other conventional growth procedures, such as rotation of the substrate, growth at pressures below atmospheric pressure, and use of a multibarrel reactor, although not essential, are compatible with the inventive technique.

As discussed, it is essential that the phosphine, before it reaches the deposition substrate, has substantially decomposed into entities such as $P_2$, $P_4$, and hydrogen moieties, i.e., H and $H_2$. (Substantial decomposition, in the context of this invention, means at least 93 mole percent of the phosphorus reacting at the deposition substrate is in a form other than phosphine.)

Generally, phosphine undergoes only heterogeneous decomposition, i.e., requires a surface to induce decomposition. Since phosphine decomposes relatively slowly at typical reactor temperatures, i.e., temperatures in the range 600 to 900 degrees C. in the presence of only the reactor walls, it is not sufficient to rely on thermal decomposition of the introduced phosphine. Thus, modification to promote decomposition is required. For example, it is possible to substantially lengthen the transit distance (assuming a given deposition temperature), to lengthen the time available for contact with walls, and thus to increase the percentage of introduced phosphine undergoing decomposition. Alternatively, it is possible to utilize a catalyst or a heated high surface area material to augment the decomposition rate and utilize a substantially shorter transit region.

Suitable materials for inducing decomposition of phosphine through catalysis, through the presence of large surface area, and/or through both, are Group VI (of the Mendelyeevian Periodic Table) metals such as tungsten and molybdenum, as well as tantalum. Typically, surface areas in the range 10 to 500 $cm^2$ for phosphine flow rates in the range 1 to 10,000 sccm yield suitable decomposition rates when the surface inducing decomposition is heated to a temperature in the range 400 to 900 degrees C. Surface areas less than 5 $cm^2$ generally lead to inadequate decomposition at temperatures and flow rates typically employed in III–V CVD. Surface areas larger than 500 $cm^2$, although not precluded, typically are inconvenient because such large surface areas require either (1) large reactor volumes or (2) the use of powders that are difficult to localize in a flowing gas system. The rate of decomposition depends on temperatures, surface area, catalytic activity, and flow rate. The conditions given are those generally adequate to yield the desired level of decomposition. For any specific conditions, a controlled sample is performed to ensure the accomplishment of a decomposition rate sufficient to eliminate the hillocks.

The phosphine need not be decomposed in the reaction chamber itself but can be decomposed in a region outside the chamber and then introduced into the chamber. Conditions should be maintained, however, so that extensive condensation of less volatile decomposition products, e.g., $P_4$, does not occur. Avoidance of excessive condensation is generally possible by maintaining the environment of the decomposition products at more than 400 degrees C.

Once the deposition of the III–V based semiconductor material(s) is effected, the rest of the device is completed. Extensive review articles on completing a wide variety of devices are available. For example, fabrication steps for V-groove lasers are described in *Journal of Applied Physics*, Vol. 56, No. 3, D. P. Wilt et al, page 710 (1984), and fabrication sequences for LEDs are described in *Bell System Technical Journal*, Vol. 62, No. 1, H. Temkin et al, page 1 (1983).

The following examples are illustrative of the invention.

EXAMPLE 1

Indium phosphide substrates were cut so that their major surface was in the (100) plane. These substrates were chemically polished by subjecting them to bromine dissolved in methanol. After polishing, the substrates were cleaved into sections measuring 0.8 in. × 1.25 in. These sections were then stored under dry nitrogen until use.

Immediately before epitaxial growth, the sections were cleaned by sequential immersion for 3 minutes in boiling trichloroethane, 3 minutes in boiling acetone, 3 minutes in boiling methanol, and 3 minutes in a room temperature 5:1:1 mixture of sulfuric acid, hydrogen peroxide, and water. The substrates were then rinsed in deionized water, rinsed in methanol, and spun dry under flowing dry nitrogen. The substrates were placed on a quartz sample holder, 19 (FIG. 1), in a reactor having a quartz chamber, 21. The chamber was evacuated to 10 Torr and then backfilled with hydrogen to a pressure of approximately 780 Torr. The reactor contained a tungsten catalyst, 80, in the form of a loosely wound coil made from 11.52 grams of 0.45 mm in diameter tungsten wire. The reactor was initially maintained with a furnace (not shown) at a temperature of 820 degrees C. in the source region, 14, shown by a dashed line, and 680 degrees C. in the growth region, 15. At these temperatures, a continuous flow of hydrogen at 500 sccm was maintained by introducing equal hydrogen flows through each of the input tubes 10, 11, 12, and 13.

To initiate growth, the flow of pure hydrogen was discontinued, a counterflow of hydrogen through tube 21 was established at 1600 sccm, and this flow was mixed with a 50 sccm hydrogen flow containing 5 percent phosphine using a mass flow controller (indicated in the Figures by MFC). After 5 minutes, the sample was translated to the preheat position (not shown) and maintained in this position for 10 minutes. An 1150 sccm flow of hydrogen was then introduced over molten indium in boats 17. A 75 sccm flow of 5 percent phosphine in hydrogen was mixed with a 750 sccm dilution flow of hydrogen. This combination was directed through tube 10. An 8 sccm flow of hydrogen containing 500 parts per million of hydrogen sulfide was combined in line 11 with a 1600 sccm flow of hydrogen. Additionally, a flow of 8 sccm of hydrogen containing 1.5 percent hydrogen chloride was introduced into line 11. These flows were allowed to stabilize for approximately 2 minutes. The sample was then translated into growth position 15 to initiate an etch removal of approximately 0.5 $\mu$m of indium phosphide. After 3 minutes, the hydrogen dilution of the 5 percent phosphine-in-hydrogen flow was terminated. The 5 percent hydrogen chloride-in-hydrogen flow was increased to 375 sccm and flowed over the liquid indium in boats 17. As a result, the growth of n-type indium phosphide was induced. After 23 minutes, the hydrogen sulfide content in its hydrogen flow was removed, and 1 gram of zinc was inserted into position, 25, where it was subjected to a temperature of approximately 375 degrees C. In this manner, growth of p-type indium phosphide was begun. After 13 minutes, the hydrogen sulfide flow was reintroduced into the hydrogen under the previously discussed conditions, the zinc was withdrawn to its initial position, and growth of the resulting n-type indium phosphide layer was continued for 19 minutes. This sequence of conditions produced a structure having an underlying n-type indium phosphide layer of 2.0 $\mu$m in thickness, an intermediary p-type indium phosphide layer of 1 $\mu$m in thickness, and a top n-type indium phosphide layer of 1 $\mu$m in thickness. V-groove lasers were then produced in this structure, as described in D. P. Wilt et al supra. These lasers had a threshold of 19 mA and delivered 10 mW/facet at 87 mA drive.

EXAMPLE 2

The procedure of Example 1 was followed, except before growth, the substrate was hand-polished. This polishing was accomplished by mounting the substrate on a vacuum chuck and rubbing the surface for 10 seconds with a cotton twill cloth that had been wetted by a 1 percent by volume bromine in methanol solution. The substrate was then rinsed with methanol and spun dry under dry nitrogen. After loading the substrate, the growth proceeded as described in Example 1 except the etch step was omitted. The resulting lasers had operating properties that were essentially the same as the lasers described in Example 1.

EXAMPLE 3

Figure 2:
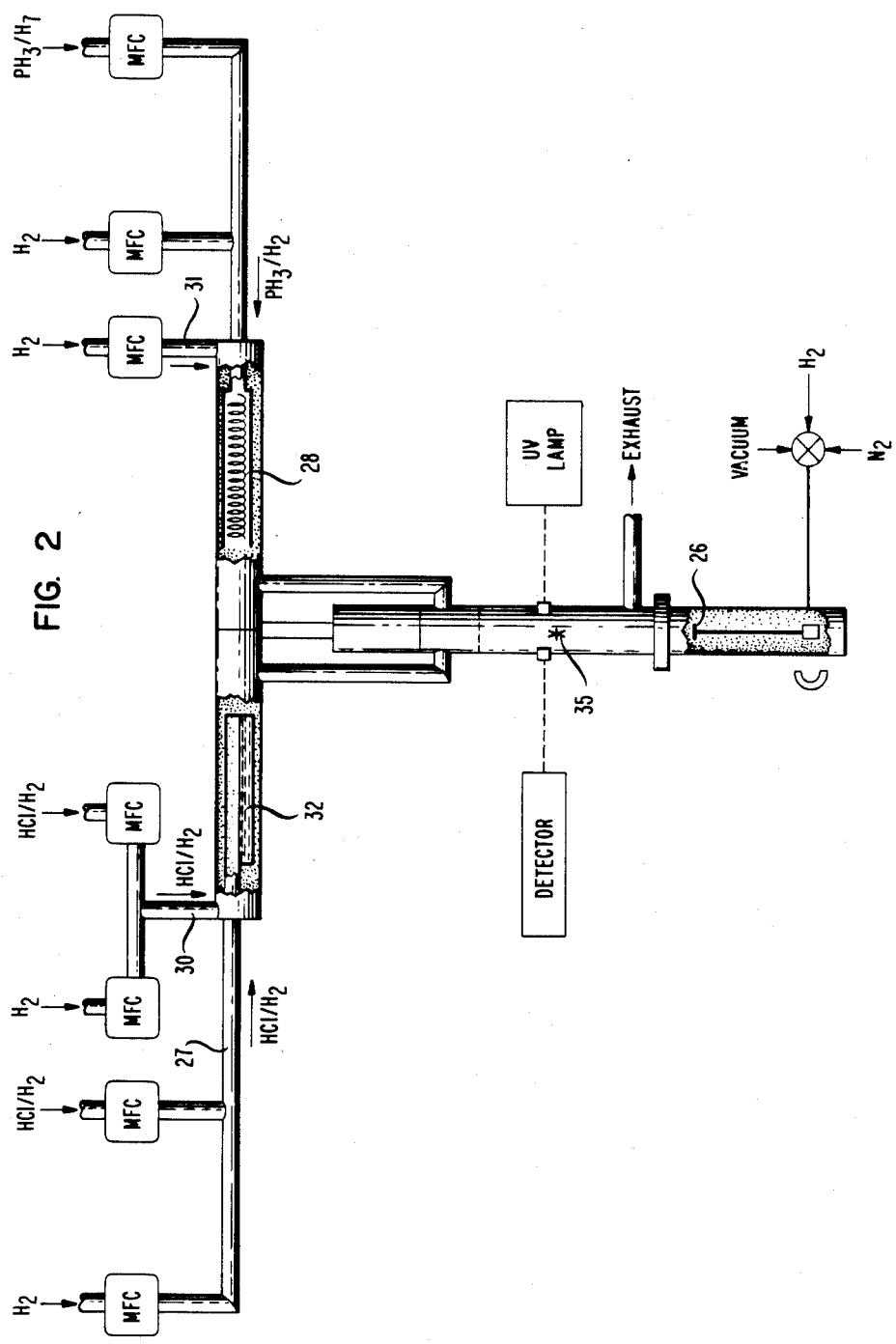

Indium phosphide substrates with their major surface in the (100) plane were cut into sections approximately 0.5 in. square and hand-polished by the procedure described in Example 2. The sections were then loaded onto the sample holder 26 of the reactor shown schematically in FIG. 2. The chamber was evacuated to a pressure of approximately 1 Torr and refilled with hydrogen to a pressure of approximately 2 psi above the pressure of the ambient. A 700 sccm flow of hydrogen was introduced through tube 30 using a mass flow controller, a 180 sccm flow of hydrogen was introduced through tube 27, a 300 sccm flow of hydrogen was begun over catalyst 28, a 275 sccm flow of phosphine was introduced into the hydrogen flow over the catalyst, and an additional 300 sccm flow of hydrogen was introduced through tube 31. All the zones of the furnace (not shown) were maintained at 700 degrees C. (The catalyst was formed by cutting 10 in. lengths from 19.3 grams of 0.25 mm in diameter tantalum wire.)

The sample was inserted into growth position 35 for 5 minutes to allow it to adjust to the growth temperature. During this adjustment period, it was verified by the UV absorption technique (190 nm) described by M. Halmann, *Journal of the Chemical Society*, 164, page 2853 (1963), that the phosphine ovr the catalyst had been completely pyrolyzed (greater than 93 mole percent).

After 5 minutes of stabilization, a 4 sccm flow of 5 percent by volume hydrogen chloride in hydrogen was established through tube 30 around indium present in boat 32 and maintained for 5 minutes to etch the sample. After 5 minutes, the 5 percent hydrogen chloride-in-hydrogen flow over the indium was begun at 160 sccm to initiate indium phosphide growth. This growth was continued for 60 minutes. The resulting indium phosphide layer was free of hillocks, as observed by Normarski contrast optical microscopy.

What is claimed is:

1. A process for forming a device comprising the steps of subjecting a substrate in a hydride epitaxy process to a phosphorus-containing vapor, inducing deposition of a phosphorus-containing composition on said substrate through interaction with said vapor, and completing said device characterized in that said phosphorus is introduced from a phosphine source wherein at least 93 mole percent of said phosphorus interacting at said substrate is in a form other than phosphine.

2. The process of claim 1 wherein said phosphine is catalytically decomposed before reaching said substrate.

3. The process of claim 1 wherein said phosphorus-containing deposition comprises a III–V semiconductor material.

4. The process of claim 1 wherein said device comprises a laser.

5. The process of claim 3 wherein said phosphine is catalytically decomposed before reaching said substrate.

6. The process of claim 4 wherein said laser comprises a V-groove laser.

7. The process of claim 5 wherein said catalyst comprises a Group VI metal or tantalum.

8. The process of claim 7 wherein said composition comprises a member chosen from the group consisting of tungsten, molybdenum, and tantalum.

* * * * *